(12) United States Patent
Yadavalli

(10) Patent No.: US 10,600,475 B2
(45) Date of Patent: Mar. 24, 2020

(54) METHOD AND APPARATUS FOR STORING AND ACCESSING MATRICES AND ARRAYS BY COLUMNS AND ROWS IN A PROCESSING UNIT

(71) Applicant: Sitaram Yadavalli, San Jose, CA (US)

(72) Inventor: Sitaram Yadavalli, San Jose, CA (US)

(*) Notice: Subject to any disclaimer, the term of this patent is extended or adjusted under 35 U.S.C. 154(b) by 0 days.

(21) Appl. No.: 15/598,322

(22) Filed: May 18, 2017

(65) Prior Publication Data
US 2019/0295631 A1 Sep. 26, 2019

Related U.S. Application Data

(60) Provisional application No. 62/338,418, filed on May 18, 2016.

(51) Int. Cl.
*G11C 8/00* (2006.01)
*G11C 11/419* (2006.01)
*G11C 11/418* (2006.01)
*G11C 11/412* (2006.01)

(52) U.S. Cl.
CPC .......... *G11C 11/419* (2013.01); *G11C 11/412* (2013.01); *G11C 11/418* (2013.01)

(58) Field of Classification Search
CPC ....................................................... G11C 7/12
USPC .................................................. 365/230.06
See application file for complete search history.

(56) References Cited

U.S. PATENT DOCUMENTS

| 4,896,294 A * | 1/1990 | Shimizu ................... G11C 8/12 365/149 |
| 5,040,150 A * | 8/1991 | Naitoh ............. G01R 31/31850 365/189.04 |
| 2002/0097623 A1* | 7/2002 | Suzuki ..................... G11C 7/22 365/210.1 |
| 2004/0151047 A1* | 8/2004 | Bartling ................... G11C 8/12 365/219 |
| 2014/0321198 A1* | 10/2014 | Naji ...................... G11C 11/165 365/148 |
| 2017/0278555 A1* | 9/2017 | Su ............................ G11C 7/12 |
| 2019/0043553 A1* | 2/2019 | Chang ................. G11C 11/4085 |
| 2019/0221262 A1* | 7/2019 | Ma .......................... G11C 15/04 |

* cited by examiner

*Primary Examiner* — Min Huang
(74) *Attorney, Agent, or Firm* — Wilson Dutra, PLLC; Camille A. Wilson

(57) ABSTRACT

This invention uses a novel mechanism to store a matrix of numbers or any two dimensional array of binary values in a novel storage entity called a Matrix Space. A matrix space which may reside in a processing unit, is designed to store a plurality of matrices or arrays of values into arrays of volatile or non-volatile memory cells or latch or flip-flop elements much like in a memory, but with accessibility in two or three dimensions. In this invention any row and/or any column of storage elements in a storage array is directly accessible for writing, reading or clearing via row bit lines and column bit lines, respectively. The elements in rows of arrays are selected or controlled for access using row address lines and the elements in columns of arrays are selected or controlled for access using column address lines. This allows access to data stored in matrix space arrays for use in matrix and array computations, by both rows and columns of the arrays.

21 Claims, 11 Drawing Sheets

One embodiment of a memory array accessible by columns and by rows along with row and column selectors and address decoders

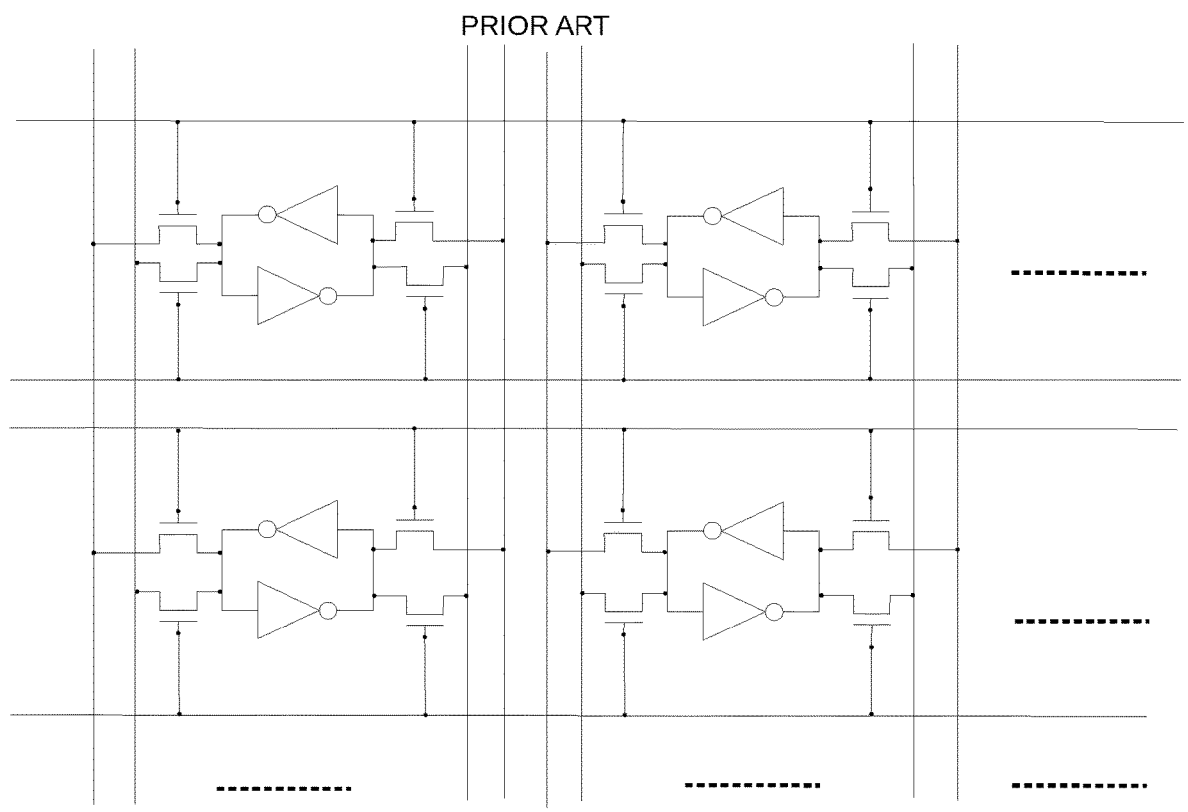
Figure 1 Schematic of a portion of an SRAM array with 2 ports as seen in Prior Art

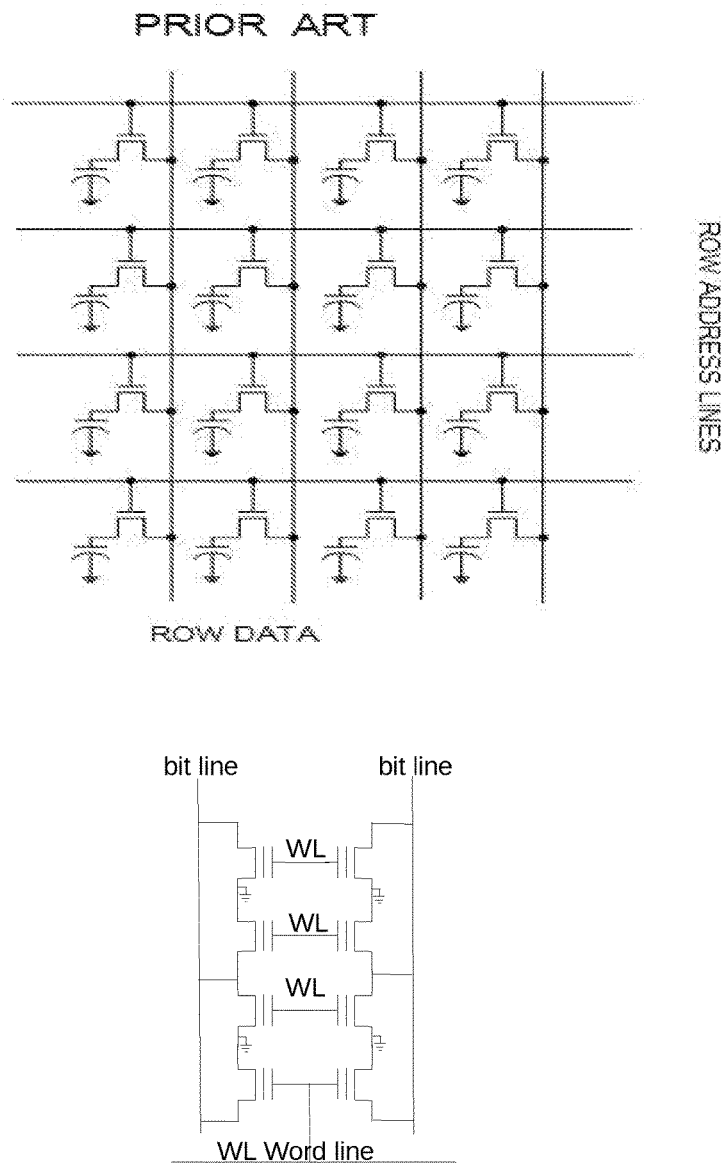
Figure 2 A schematic example of a DRAM and a non-volatile storage in Prior Art

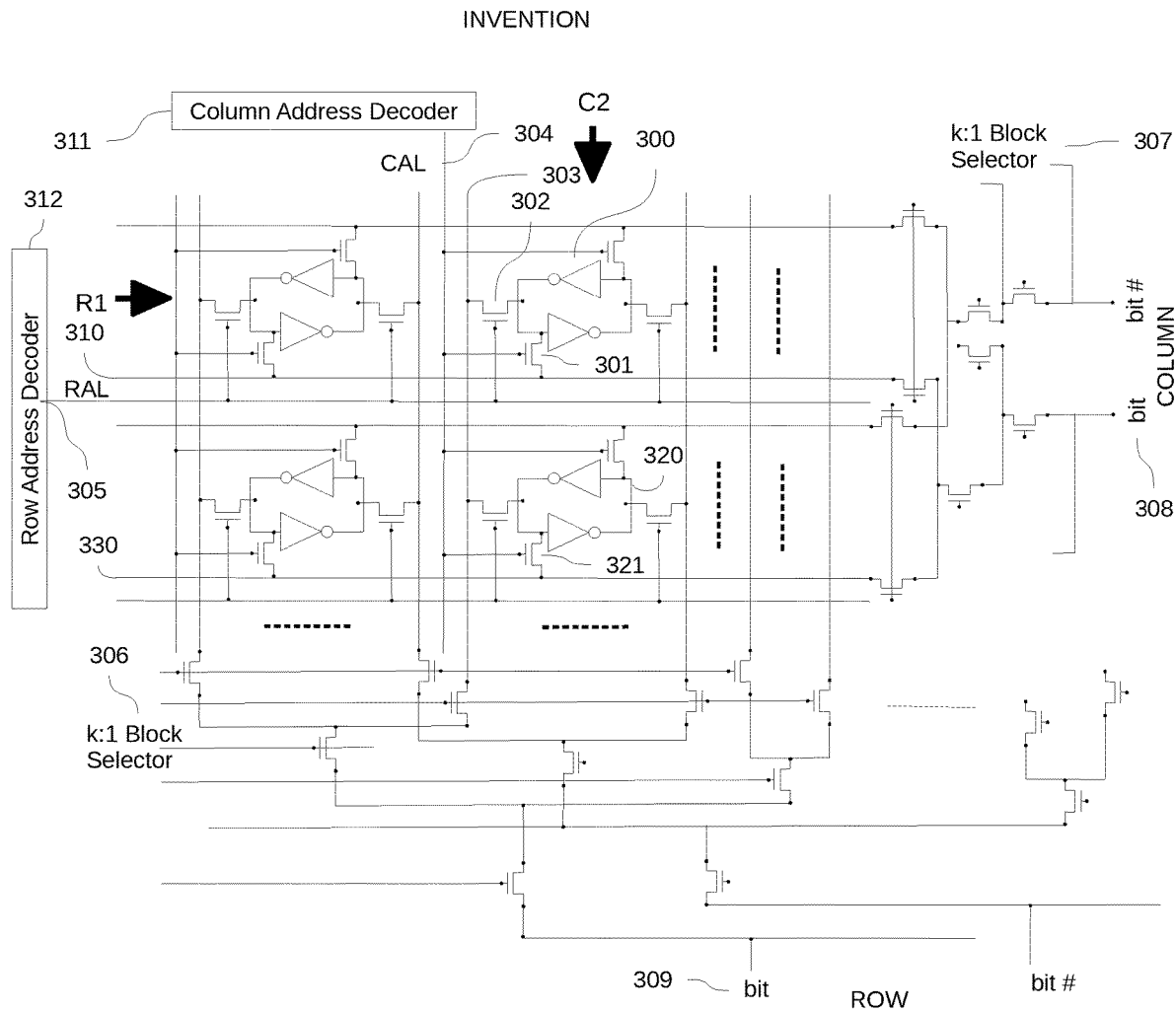
FIGURE 3. One embodiment of a memory array accessible by columns and by rows along with row and column selectors and address decoders

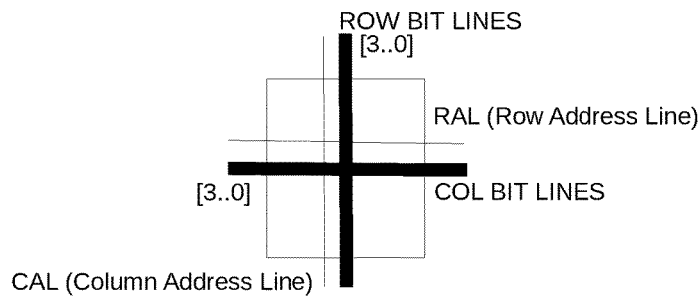
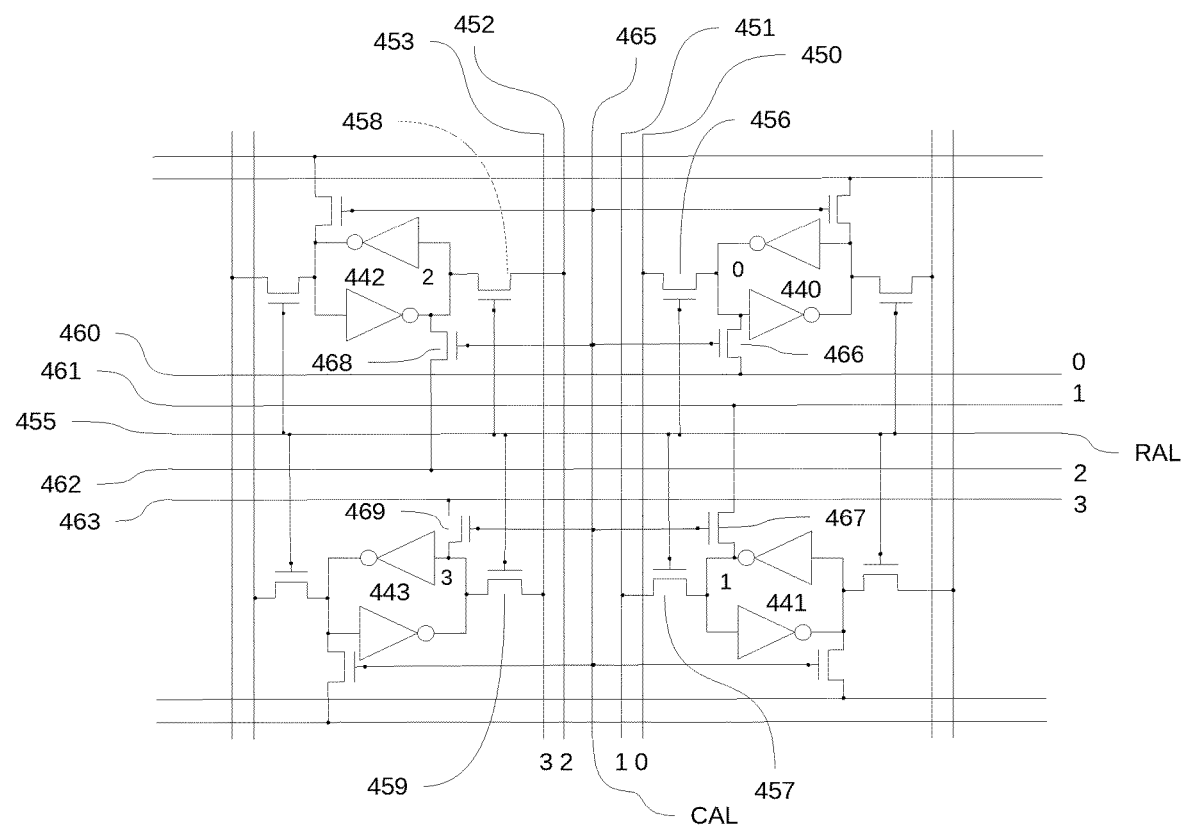
FIGURE 4 : One embodiment of a column & row accessible 4-bit (nibble) cell INVENTION
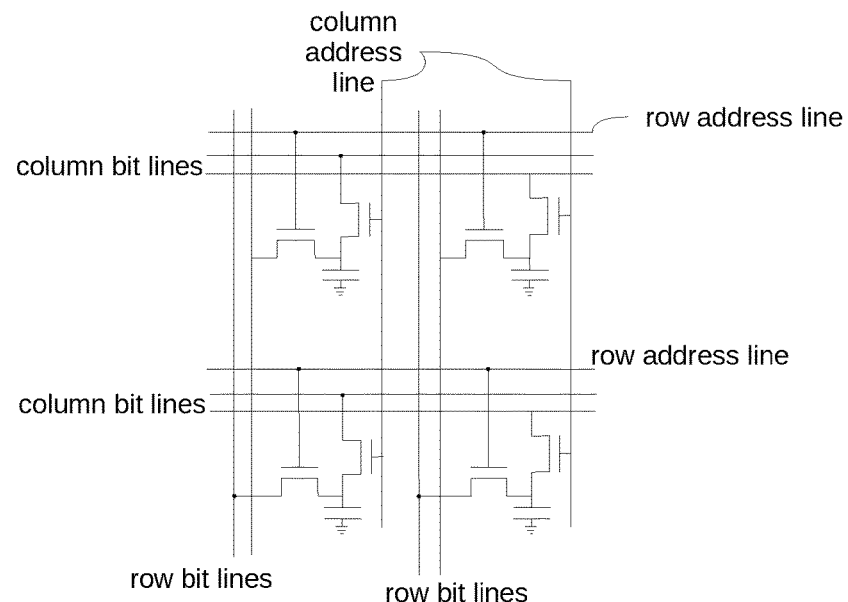
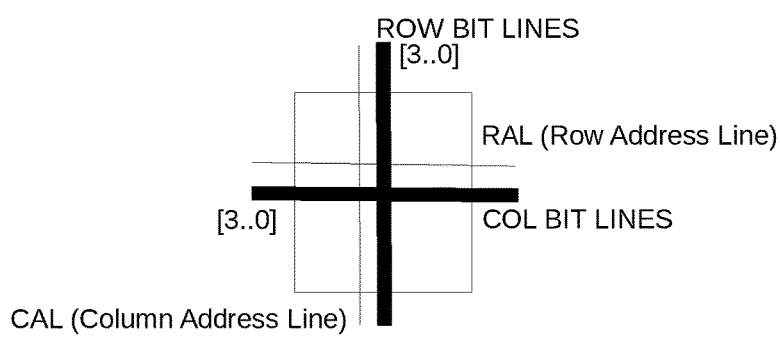
Icon of a 4-bit cell accessible by column & by row
FIGURE 5 : One embodiment of a column & row accessible 4-bit (nibble) cell

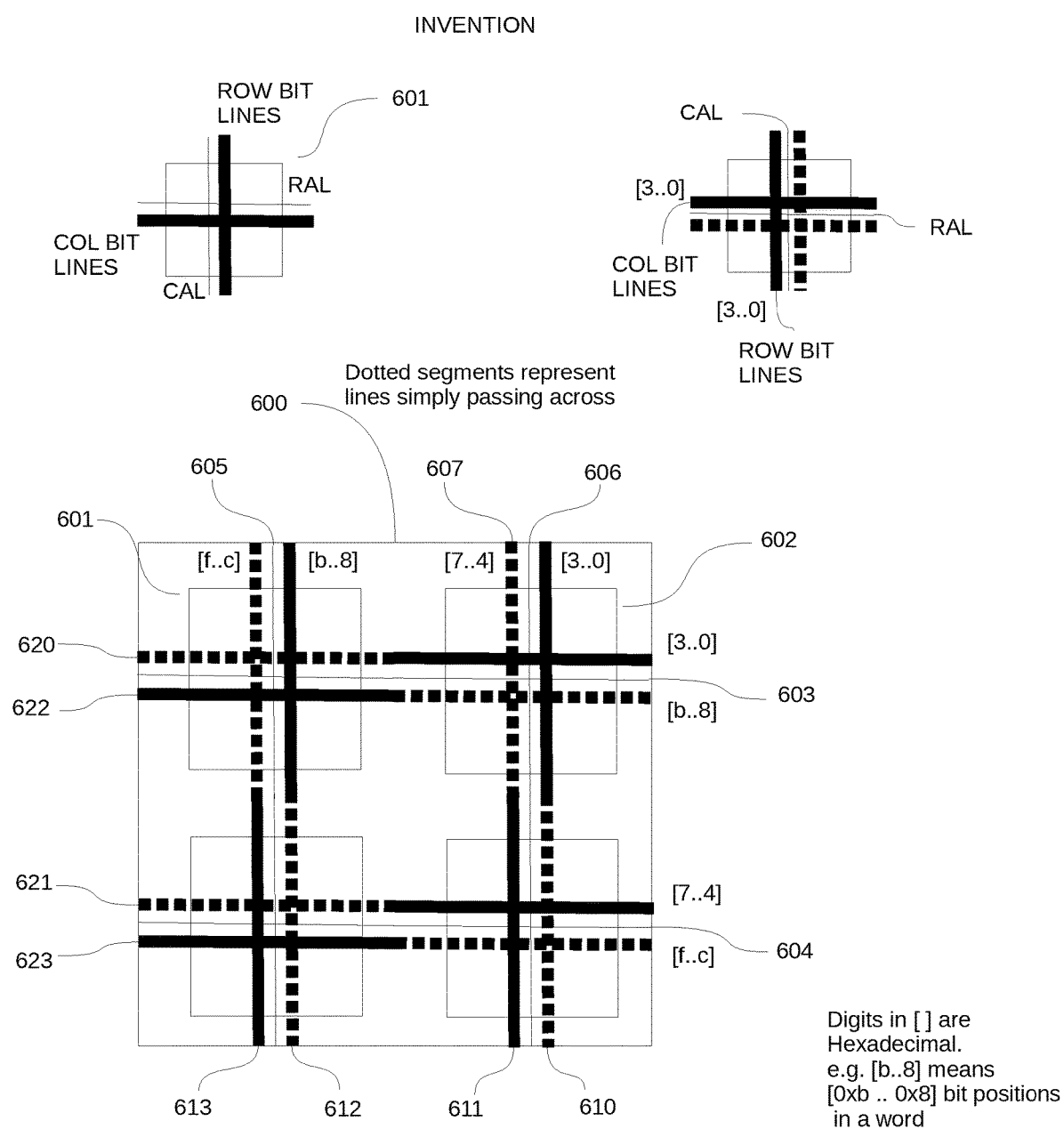
FIGURE 6 : One embodiment of a column & row accessible 16-bit word cell

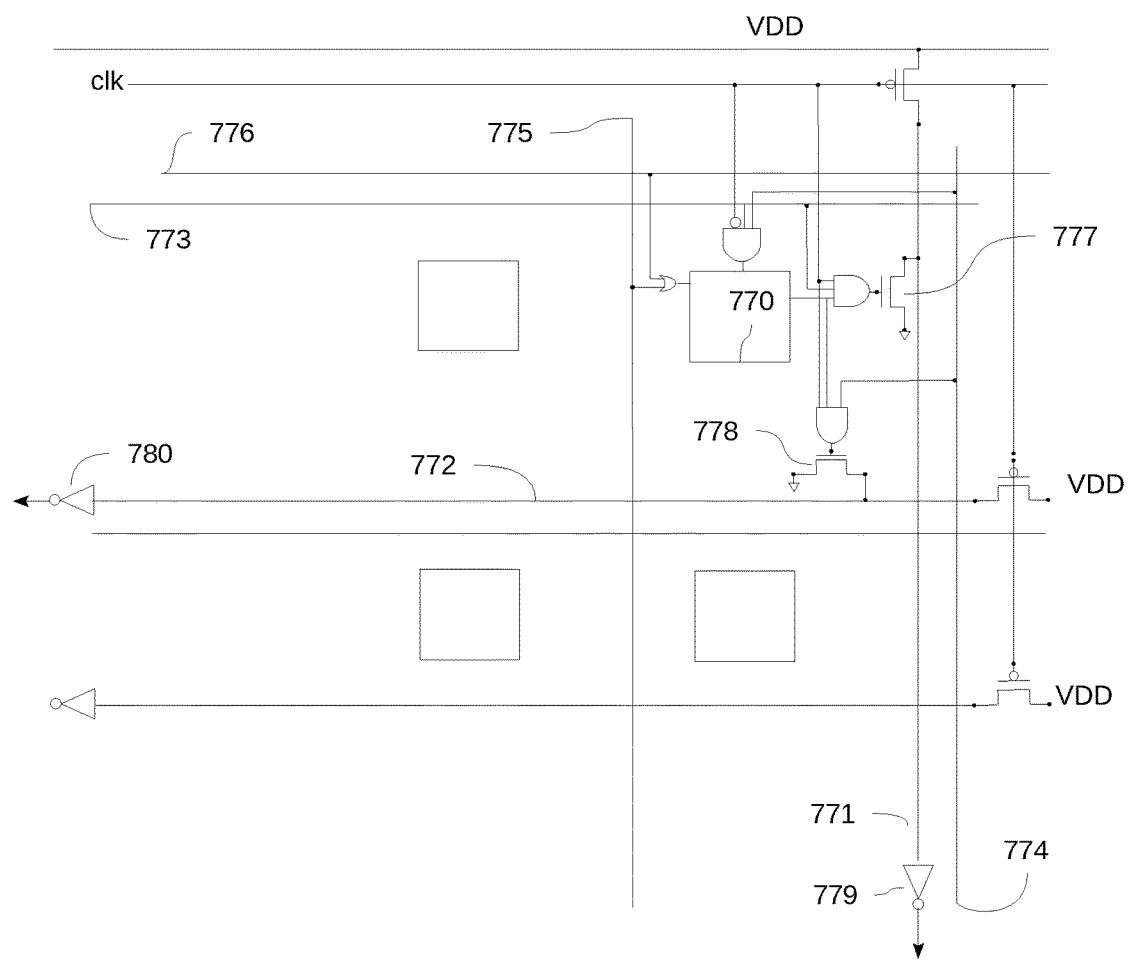
FIGURE 7 : One embodiment of a column & row addressable and accessible 4-bit (nibble) cell with gates and latches

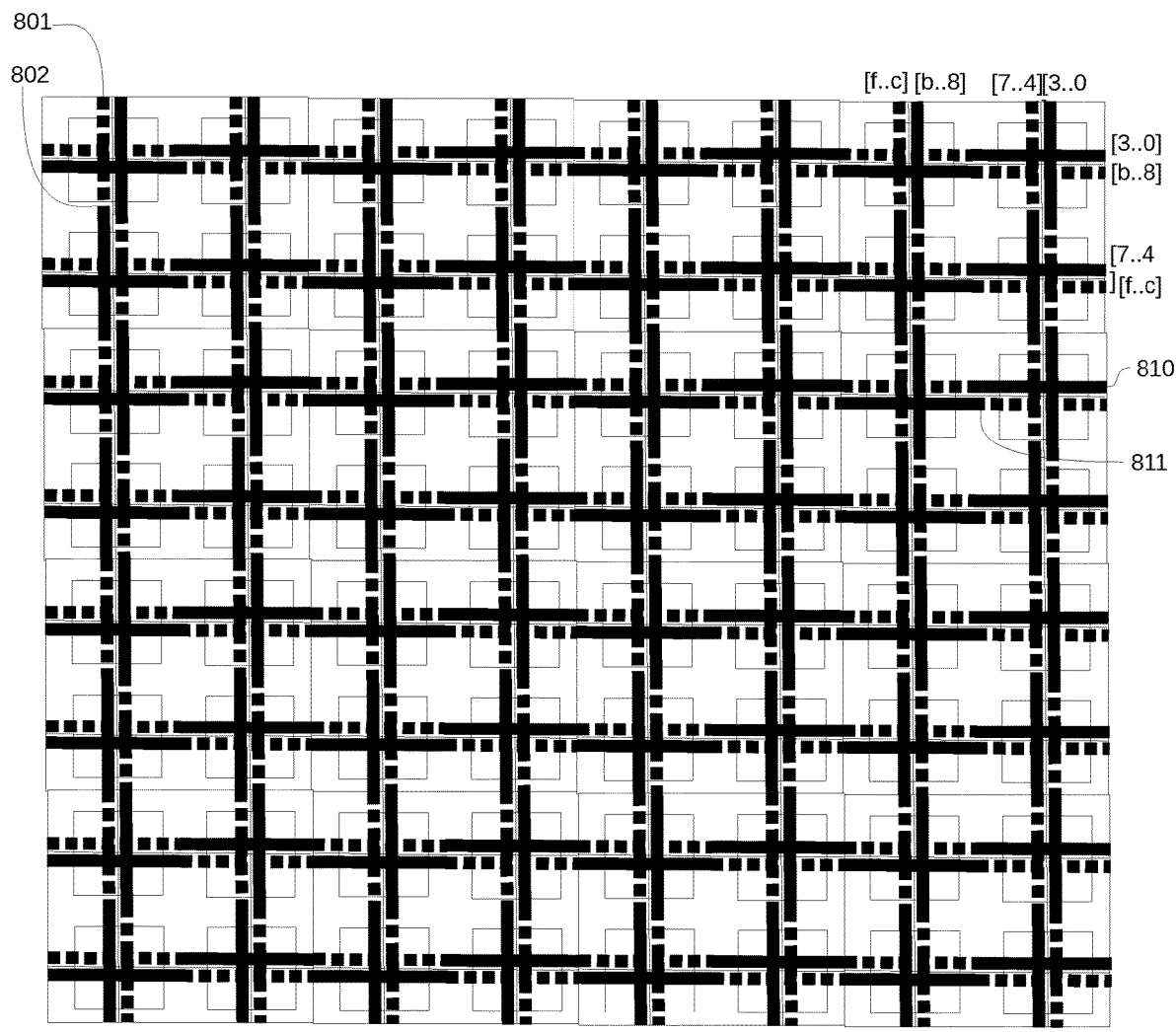
FIGURE 8 : One embodiment of a column & row accessible RAM block of short words using 4-bit cells

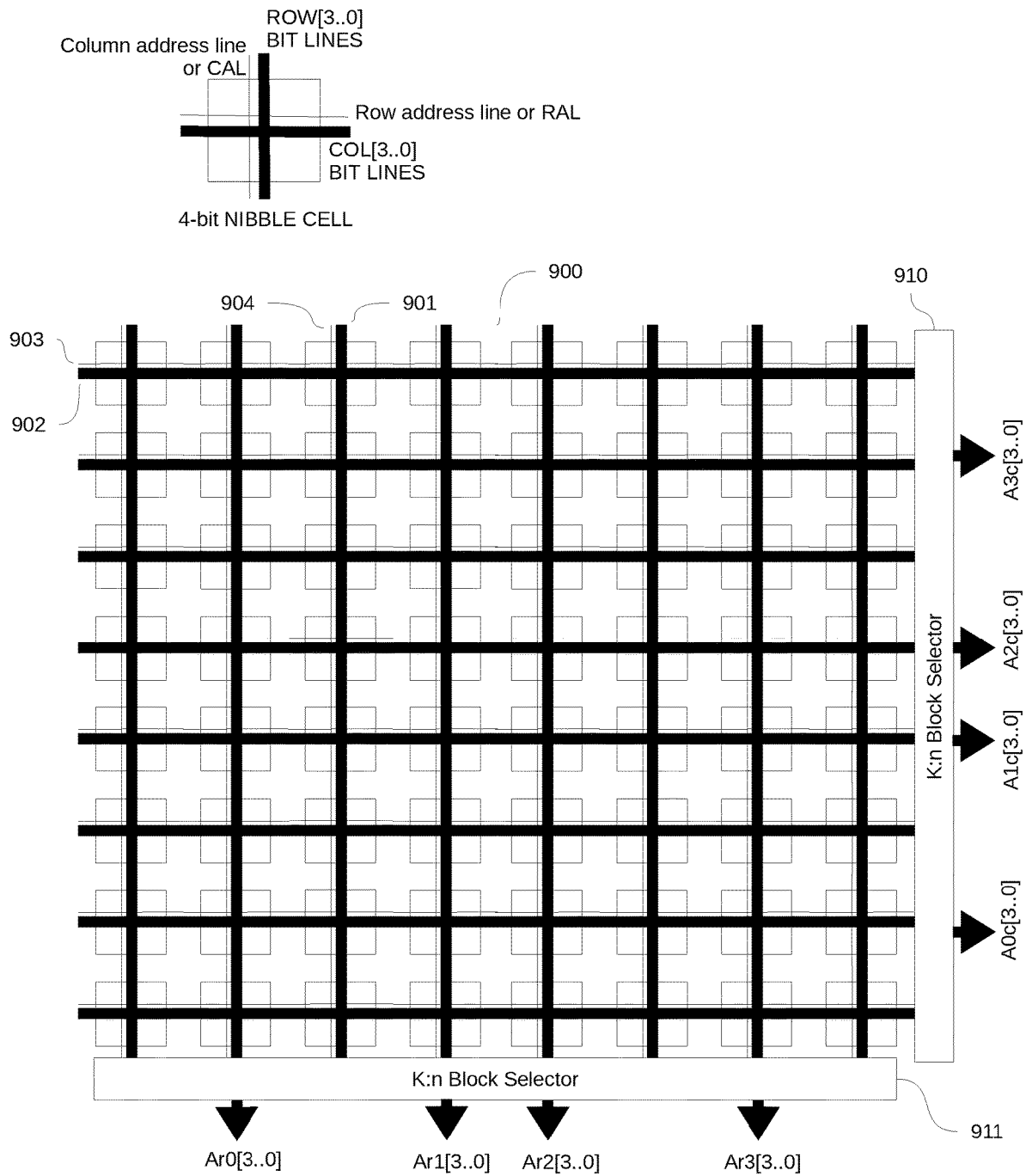
FIGURE 9 : One embodiment of an array of nibble cells with column and row selectors

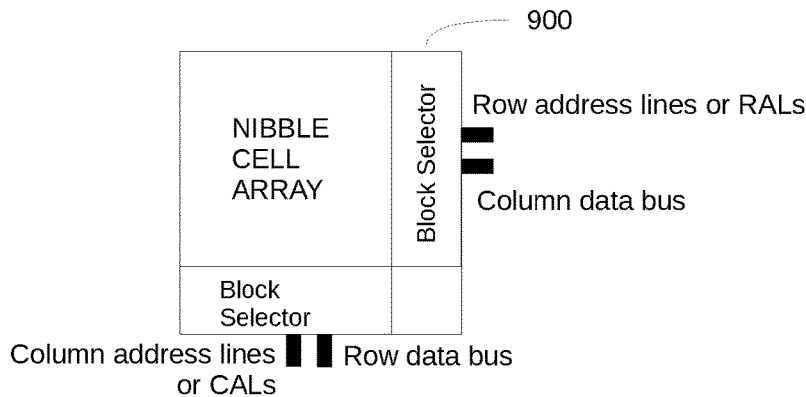
Icon for an array of nibble cells with column and row block selectors and column and row address lines
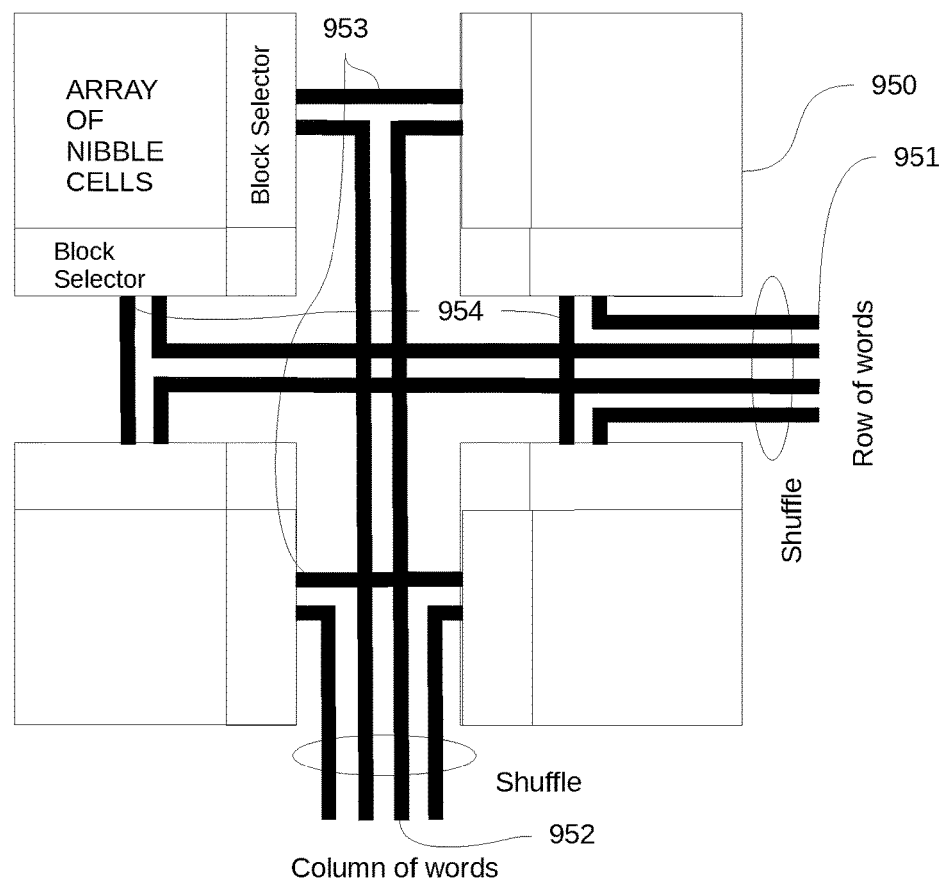
Figure 10  One embodiment showing a compact array of words

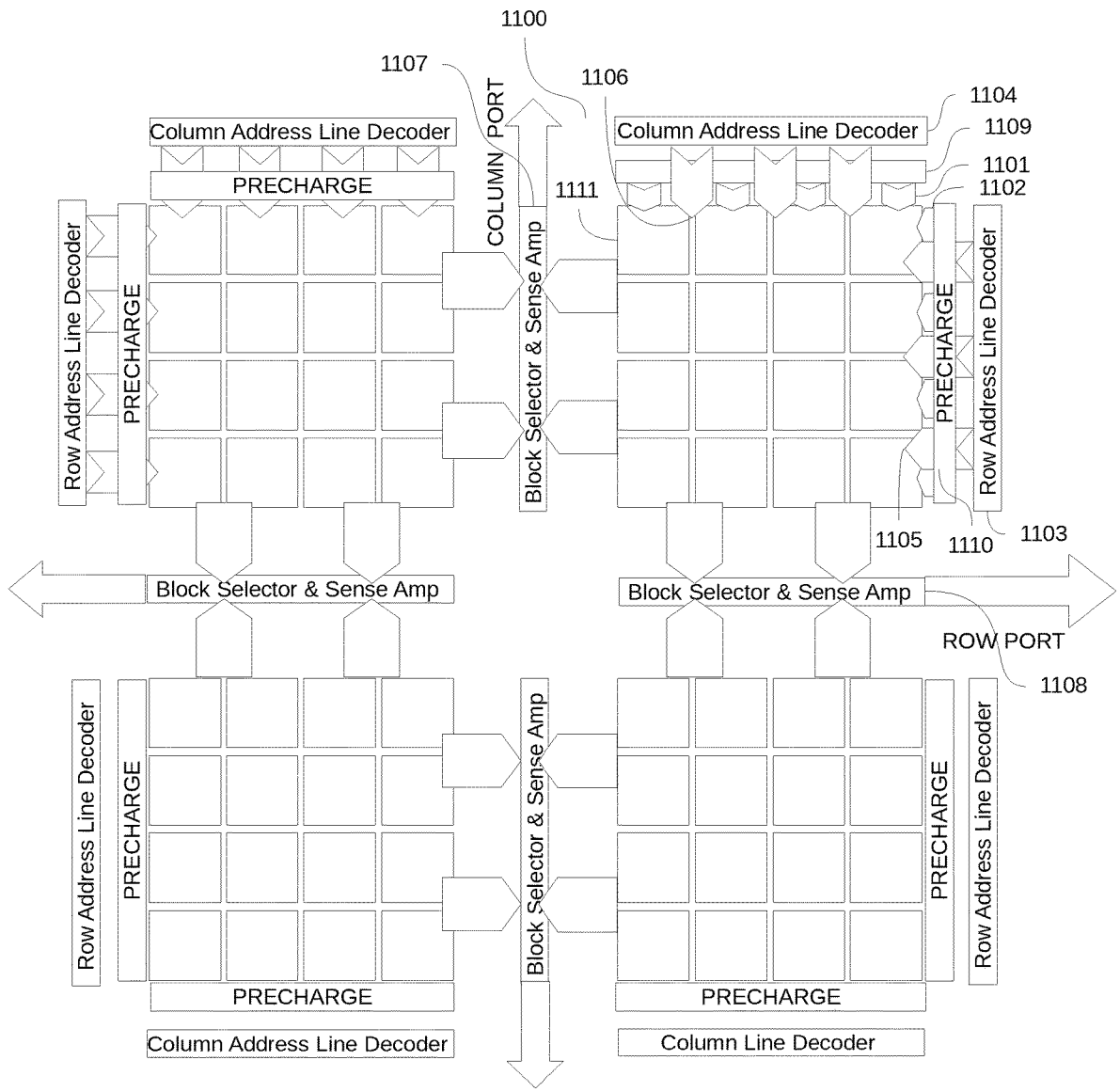
FIGURE 11: One embodiment of a column & row accessible RAM of long words to construct a matrix space

METHOD AND APPARATUS FOR STORING AND ACCESSING MATRICES AND ARRAYS BY COLUMNS AND ROWS IN A PROCESSING UNIT

CROSS-REFERENCE TO RELATED DOCUMENTS

The present application claims benefit of U.S. Provisional Application Ser. No. U.S. 62/338,418 filed on 18 May 2016 and which application is incorporated herein by reference. To the extent appropriate, a claim of priority is made to the above disclosed application.

BRIEF SUMMARY OF THE INVENTION

This invention uses a novel mechanism to store a matrix of numbers or any two dimensional array of binary values in a novel storage entity called a Matrix Space. A Matrix Space that may reside in a processor is designed to store a plurality of matrices or arrays or matroids (3D array of numbers) using individual volatile or non-volatile RAM (Random Access Memory) cells or latch (or flip-flop) elements, much like in a memory but with accessibility in two or three dimensions. In this invention any row and/or column of a storage array is directly accessible via row and column bit lines respectively. The values in a row of the matrix or array are selected for access using row address lines and the values in the columns of the matrix or array are selected for access using column address lines (much like word lines). This allows access to data words in matrices and arrays by columns and by rows of a matrix/array to use them in parallel matrix/array computations.

BRIEF DESCRIPTION OF THE DRAWINGS

FIG. 1 is the schematic of a portion of an SRAM array with two ports as seen in Prior Art.

FIG. 2 is a schematic example of a DRAM and a non-volatile storage in Prior Art.

FIG. 3 is one embodiment of a memory array accessible by columns and by rows along with row and column selectors and address decoders.

FIG. 4 shows one embodiment of a 4-bit cell addressable and accessible by rows and by columns as a 4-bit value.

FIG. 5 shows a schematic of one embodiment of a 4-bit cell made of dynamic or non-volatile storage cells which are addressable and accessible by rows and by columns as a 4-bit value.

FIG. 6 shows a block diagram of one embodiment of a column & row addressable and accessible 16-bit word cell composed of 4-bit cells.

FIG. 7 shows an outline of a column and row accessible and addressable 4-bit (nibble) cell made of logic gates and latches in one embodiment.

FIG. 8 has one embodiment of an array of 16-bit words accessible and addressable by columns and rows.

FIG. 9 shows one embodiment of an array of nibble cells with column and row selectors and which is accessible and addressable by columns and by rows.

FIG. 10 shows one embodiment of a compact array of 16-bit words comprising of four arrays of nibble cells that is accessible and addressable by columns and by rows.

FIG. 11 shows one embodiment of a matrix space composed of arrays of words accessible and addressable by columns and by rows.

BACKGROUND OF THE INVENTION AND DESCRIPTION OF PRIOR ART

In mathematics, a matrix is a 2-dimensional (2D) array of numerical elements. We extend this to any regular 2D array or collection of numbers or characters or ordered pairs or simply binary values. A generalization to a 3D or higher dimensional array or collection of binary values referred to as a matroid, is also included in this invention. This invention considers matroids to be stored as layers of 2D matrices in a stacked semiconductor device or alternately, stored as multiple 2D matrices along the third spatial dimension. A vector is a matrix with 1 column or with 1 row as is commonly understood.

Parallel processing of arithmetic vectors in SIMD (Single Instruction Multiple Data) paradigm has been prior art for several years now. That involves vectors of numbers stored in vector registers such that one or more of vector registers are used in a vector computation much like scalar numbers are used in a scalar computation. In prior art, a plurality of numbers may be stored as a vector in a register file or a memory such as those shown in FIGS. 1 and 2. They are read along one interface of bit-lines of the register-file and presented to several identical computing elements. In prior art, a matrix may be stored using multiple vector registers where each row of the matrix (row major) can be read at the interface as row data for computation. Alternately, in prior art, the matrix is stored as one column per vector register (column major) and read one matrix column length at a time for computation. In prior art, a matrix stored using its rows is not readable by its columns along its data interface. In such a case only individual row length of elements of the matrix can be directly accessed in any computation. Otherwise, a complicated transformation of the row major (or column major) matrix to its transpose is needed.

Prior art uses a register file or a multi-port RAM to store binary values or numbers or characters as operands for computation. In prior art, plurality of bits of a numerical value (i.e. a number) are stored in a single string of RAM cells forming a register in a register file. When accessed all the bits of the register are addressed using a word-line and are available at the same time. Vector values are stored in longer registers which store a plurality of scalar binary values that are accessible using a common address and are available at the same time. As an example, in prior art, a 128 bit vector register can be divided to hold 16 byte values or eight 16-bit short integers or four 32-bit integers or two 64-bit long integers The vector register file or any register file in prior art uses a set of word-lines to access or address its individual registers and the values in the cells of the addressed register are read out on to an interface of bit-lines. This puts a limitation on the prior art that does not allow a column vector of elements of a register file to be read out in a single operation to perform computations directly on them collectively. This also means that a simple individual assembly language instruction cannot be used to directly access and process a column of a matrix or array that is stored as row vectors in a vector register file. Analogously, it means that it is not possible to use a set of simple assembly language instructions to directly access and process a row of numbers in a matrix stored by its columns in a vector register file. Such a limitation, for instance, does not allow direct computation of the product of a matrix with itself. Such a computation can be performed only after reading the matrix as a series of row vectors and then using several program steps to obtain the column vectors by extracting individual column elements from each row vector and then performing the multiplication. Alternately, it requires a transformation of the matrix or creation of a transposed copy of the matrix to carry out the product operation.

This invention describes a mechanism to eliminate the above mentioned limitations to store and access a matrix or array of numbers or binary valued words in a processing unit for performing computations that require accessing elements along both the rows and columns of the matrices or arrays.

Systolic Array and Tile Architectures (Prior Art)

Systolic array architectures are Multi-instruction Multi-data machines that use multiple processors arranged in a grid like fashion. Each processor element of the systolic array performs computation on a matrix element and forwards the result to the succeeding element. There are several ways computations proceed as listed in the references. All of these architectures utilize some kind or other of a compute-and-forward process, moving the result from one storage and compute element to another. The storage is distributed across all the computing elements. These architectures often need a crossbar or other network on a chip fabric. Systolic arrays are not simple memory arrays and hence they are less dense and consume more power than memories. Further, they use an MIMD programming paradigm or a data flow computing paradigm and may not be suitable for use inside regular processing units.

These limitations are addressed in the current invention as described below.

DETAILED DESCRIPTION OF THE INVENTION

This invention uses a novel mechanism to store a matrix of numbers or any generic array of values in a new storage entity called a Matrix Space. A matrix space that may reside in a processing unit is designed to store one or more matrices or arrays or matroids (3D array of numbers) using individual storage cells or latch elements, much like in any randomly accessible volatile or non-volatile memory but which are accessible in two dimensions, both along the rows or along the columns of the array.

Structure of the Matrix Space (Invention)

FIG. 3 shows the block diagram of one embodiment of a matrix space. The matrix space has several rows of storage cells. However, unlike prior art each storage cell can be accessed along the column or row of the matrix of cells. A matrix space has bit lines along both rows and columns of the matrix of cells as seen in the embodiment shown in FIG. 3. Likewise, unlike a register file or memory block, a matrix space also has controlling word lines along both rows and columns of the matrix of cells. This allows read and write access to an entire row of storage elements and also to an entire column of storage elements concurrently. Thus cells in matrix space storage are addressable and data stored is accessible by rows and by columns.

It is easy to understand that any rotation, translation or reflection of a matrix space is also a matrix space. It is also easy to understand that additional circuitry can be added to cells in a matrix space to clear the value in a cell to 0 or set to 1 much like for a generic memory or storage cell with preset or clear.

Accessing Rows and Columns of a Matrix stored in a Matrix Space

In one embodiment of the invention incorporating the novel matrix space shown in FIG. 3, the storage array can be accessed along its rows or along its columns, simultaneously. The elements of a matrix or array stored in cells [300] inside this matrix space accessible simultaneously or separately along two different sets of ports [308] and [309]. The matrix space uses a plurality of word-lines [305] called row address lines (abbreviated as RALs) and another plurality of word lines [304] called column address lines (abbreviated as CALs) in the perpendicular direction to the length of RALs [305]. RALs like [305] are coupled to cells in individual rows of the matrix space while CALs like [304] are coupled to cells in individual columns of the matrix space. Each individual RAL controls a plurality of elements of a row of a portion or block or bank of a matrix space. To access a row R1 of a block in the matrix space, an address is presented to a row address decoder [312] to select the corresponding RAL [305] which is coupled to cells like [300] in that row R1. These cells like [300] are selected and read on to a bus of row bit lines (abbreviated as RBLs) [303] via coupling Field Effect Transistors (FETs) [302] as shown in the embodiment in FIG. 3. The plurality of binary values that appear on the bus of row bit lines [303] pass through a block selecting decoder [306] and appear on a port [309] of the matrix space.

Analogously, in the embodiment shown in FIG. 3, an individual CAL [304] controls individual FETs like [301] that couple a column of storage cells [300] and [320] to corresponding column bit lines such as [310], [330], respectively, there by controlling the access to the corresponding column C2 of the matrix or array inside a block of a matrix space. To access a column C2 of the Matrix Space containing the cell [300] an address is presented to a column address decoder [311] to select a corresponding CAL [304] so that the values in the corresponding coupled storage cells [300] and [320] in that column are selected to be read on to a bus of column bit lines (abbreviated as CBLs) [310] and [330] via coupling FETs [301], [321]. The values on CBL bus formed by [310], [330] and such, appear on the port [308] of the matrix space when selected by a block selecting decoder [307] in the embodiment in FIG. 3.

To write values into a column C2 of cells including cells [300, 320], the column bit lines [310], [330] and such, are forced with the corresponding bit values to be written into the column C2. Concurrently the CAL [304] is selected by presenting the column address to column address decoder [311] which turns on the coupled FETs [301], [321] and such (and their partners on the complementary column bit# lines, if present). Due to the superior drive of the buffers (not shown) driving the bit lines the values in the storage cells take the driven values and complete the writing process. An analogous process to the one above can be used to write values to a row R1 of cells using the corresponding row bit lines and the RAL [305] selecting the row.

Storing and accessing matrix or array holding 4-bit (nibble) values

It may be noted that the values read as rows or columns via individual bit lines from the matrix or array stored in the portion of matrix space in the embodiment shown in FIG. 3 are all individual bits. If a row of bits read on port [309] using RAL [305] represent an integer value v1 with element [300] contributing a single bit among those comprising v1 then when a column of bits are read on port [309] using CAL [304] coupled to cell [300] contributing a single bit among those comprising value v2, the rest of the bits in v2 will not be related to value v1 in any way. Here v2 is not equal to v1. Hence, it becomes clear that any matrix or array stored in the embodiment of FIG. 3 without further arrangement is simply a matrix or array of bits.

It is commonly understood that a byte is a generic 8-bit binary value and a nibble is a generic 4-bit binary value. A short word typically comprises of 16-bit values and is used as a short integer or a wide character. A word is a generic term for a binary value longer than a byte. An integer is typically represented as a 32-bit or 64-bit value, while a long integer is typically a 64-bit value. Besides these, binary values stored in register cells may represent ordered pairs, a quad (or collection of four) of binary values, complex numbers or floating point numbers of various kinds and so on.

In order to store a nibble, a byte, a short word, or any binary word in the embodiment shown in FIG. 3, these entities must be reconstructed out of bit matrices after reading out bits on row or column ports [309], [308] and such using a network of multiplexors and de-multiplexors.

Alternately, one embodiment shown in FIG. 4 shows an arrangement where four bits, typically adjacent bits, stored in four storage elements form a 4-bit nibble cell or 4-bit quad cell which can be accessed easily both along a column or a row. In this embodiment the matrix space comprises of these nibble cells which are a quad of 4-bits as in the figure. This allows a 4-bit value, say n1, to be stored in four storage elements [443, 442, 441, 440], one bit per element. In the embodiment of FIG. 4, to read out the nibble stored in [443, 442, 441, 440] on row bit lines (vertical bit lines in figure) [453, 452, 451, 450] respectively, a 1-hot decoded address is presented on a row address line [455] which turns on coupling FETs [456, 457, 458, 459] through which the stored values appear on the row bit lines. To read the same value n1 out from the elements [443, 442, 441, 440] on to column bit lines (horizontal bit lines in FIG. 4), a 1-hot decoded address is placed on a column address line [465] in the embodiment of FIG. 4. This turns on the coupling FETs [466, 467, 468, 469] through which the values from the storage element are driven on to column bit lines [463, 462, 461, 460] respectively. An icon shown in FIG. 4 may be used to succinctly represent embodiments of such quad of storage elements as described previously which we call a nibble cell.

Blocks of nibble cells, an example of which was described in FIG. 4, in various embodiments may be used along with block selection decoders such as [306] and [307] shown in FIG. 3 to construct multi-block array spaces holding nibble matrices and arrays. An arranged collection of these would form a matrix space capable of holding integer or longer binary values. FIG. 5 shows one embodiment of a nibble cell that uses dynamic memory or non-volatile memory elements for storage. Without loss of generality it is well understood from the embodiments shown in FIGS. 4 & 5 that the storage element in a nibble cell may be a static RAM cell, a dynamic RAM cell or a non-volatile memory cell and the 4-bit nibble cell architecture uses the same elements of the invention like the row and column bit lines and row and column address lines.

Nibble Cell Made of Flip-flops or Latches

A cell to hold a nibble value (4-bits) for matrix space for matrix computing can be made in a plurality of ways. As long as the nibble value in a storage element can be addressed, stored and accessed (written or read or possibly cleared) along the length of a row or along the length of a column of an array, it can be used to construct a larger array to hold nibbles, 16-bit shorts words or longer binary values. FIG. 7 shows one embodiment of a 4-bit nibble cell that uses flip-flops or latches, logic gates and single ended bit lines.

In one embodiment of the invention shown in FIG. 7, to read a 1 value from cell [770] on to a row bit line [771], this bit-line is first pre-charged to a 1 or VDD during the pre-charge phase of the clock [clk] (pre-charge circuit not shown); then a row address line [773] is selected during the read phase of clock [clk] which causes the NMOS [777] of a NOR gate to pull down the bit line [771] which causes a 1 to be presented at the output of the inverter [779]. A 0 values in cell [770] when presented on the gate of [777] during the read phase of the clock [clk] does not turn it on and the pre-charged 1 (from the pre-charge phase) on the row bit line [771] is retained which drives inverter [779] to a 0.

To read a value on to the column bit lines [772], this bit-line is first pre-charged to a 1 or VDD during the pre-charge phase of the clock [clk] (pre-charge circuit not shown); the column address line [774] is selected during the read phase of clock [clk], which transfers the stored value from the cell [770] to the column bit lines [772] via the pull-down NMOS [778] of a NOR gate and appears at the output of the inverter [780]. To write a value to the cells from a row bit line [775], the corresponding row address line [773] is selected and the value is transferred to a storage element [770] during a write phase of clock [clk]. An analogous process is used to write a value to a storage element from a column bit lines [776] during write phase oc clock [clk] by selecting the column address line [774]. The two write bit lines [775] and [776] may be either multiplexed using the address word lines [773, 774] for generic use or simply combined using an OR gate, under certain mutual exclusion constraints to produce the value to be stored.

A Macro Cell for Storing and Accessing 16-Bit Short Word Values

A cell to hold a nibble value (or 4-bits) for matrix computing can be made in a plurality of ways. As long as nibble values in storage elements can be addressed, stored and accessed (written or read or possibly cleared) along the length of a row or along the length of a column of an array, they can be used to construct larger arrays to hold nibbles, bytes, short words or longer binary words.

In one embodiment shown in FIG. 6, a macro cell [600] comprised of four nibble cells some embodiments of which are shown in FIGS. 4 & 5, is used to store 16-bit short binary words. In such a macro cell [600] a single nibble cell such as [601] holds 4 bits of a 16-bit short binary word. The wide dotted lines such as [607] in the FIG. 6 denote pass-through buses that make the arrangement more compact and organized; a bus such as [607] does not affect the logic of a cell such as [602] with which it is not directly coupled but across which it passes through. Buses [620], [621], [622], [623] carry bits 0 to 3 shown as [3..0], bits 4 to 7 shown as [7..4], bits 8 to 11 shown as [b..8], and bits 12 to 15 shown as [f.c], respectively. Here, [b..8] represents hexadecimals 0x8 through 0xb, while [f.c] represents hexadecimals 0xc through 0xf, and denote bit positions.

To understand the function of the embodiment shown in FIG. 6, let us suppose a short word v1 is stored in the macro cell shown. When a row address is decoded and the controlling row address lines (RAL) [603] and [604] are selected the coupled storage cell contents are read out on corresponding row bit lines (vertical bit lines in the FIG. 6) [610, 611, 612, 613] that form a row data bus. Concatenating the nibbles on the row data bus in the order [613.612.611.610]) gives the short word v1; here (.) denotes the concatenation operation.

Analogously, when a column address is decoded and the controlling column address lines (CAL) [605] and [606] are selected the contents in the coupled storage cells such as [601], [602], etc., are read out on to the corresponding column bit lines (horizontal bit lines in figure) that form the column data buses [620, 621, 622, 623]. Concatenating the nibbles on the column data buses in the order [623.622.621.620] gives the short word v1 stored in the macro cell.

Writing a short word value into the array via row data buses is as easy as placing a short value, say, v1 on the buses and selecting the controlling row address lines [603] & [604]. In an analogous process, a value v1 is driven on to the column data buses [620, 621, 622, 623] and selecting the controlling column address lines [605] & [606] stores v1 into the macro cell.

Column and Row Accessible and Addressable Array of Words

FIG. 8 shows one embodiment with an array of macro cells to store an array of short binary words. The row bit lines (vertical bit lines in FIG. 8) in row data buses [801, 802 and such] are coupled to form longer row bit lines; and the controlling row address lines are coupled along the corresponding rows. Analogously, as shown, column bit lines (horizontal bit lines in FIG. 8) in column data buses [810, 811 and such] are coupled to form longer column bit lines and the controlling column address lines are coupled along the corresponding columns. The two sets of pre-charge circuits coupled to column bit lines and to row bit lines, as well as the row and column address decoders coupled to row and column address lines are not shown in FIG. 8.

Alternate Design to Hold a Compact Array of Words

One embodiment shown in FIG. 9 is an array of words made of a plurality of nibble cells, some embodiments of which are shown in FIGS. 4 & 5. A cell to hold a nibble value (4-bits) can be made in a plurality of ways. As long as a nibble value can be stored, retrieved and accessed (written or read or cleared) along a row or along a column of a matrix or an array, it can be used to construct a larger array to hold nibbles, bytes, short word values or words of any length. As shown in this embodiment of the invention, row bit lines (vertical bit lines in figure) [901] are coupled along each column length of the array. The controlling row address lines such as [903] along a row are all coupled. Also, the column bit lines (horizontal bit lines in figure) such as [902] along a row are all coupled. And the controlling column address lines such as [904] are coupled along each column. Nibble values read on a plurality of row bit lines such as [901] using previously described methods, are selected via block selector [911] which provides a vector of nibbles at its output. Analogously, nibble values read from the stored cells on to a plurality of column bit lines such as [902] via previously described methods, are selected via block selectors [910] which provides a vector of nibbles at its output.

An icon representing an embodiment of an Array of Nibbles with Block Selectors is shown at the top of FIG. 10 in a concise drawing, to be used further.

FIG. 10 shows one embodiment of an array of words comprised of four arrays of nibbles which were described previously. This embodiment of an array of words stores 16-bit short binary words that can be accessed by rows and by columns at the respective ports coupled to [951] and [952]. Upon selecting a subset of a plurality of controlling row address lines (RAL) comprising [953], the coupled and controlled row bit lines inside array [950] receive values from the storage cells in [950] for the rows selected. Based on the block selection made in [950], the selected row values of the selected blocks appear on the coupled row data bus [951]. Each nibble array provides one of four nibbles for each short word that is read out.

Analogously, selecting a plurality of columns by selecting a subset of a plurality of controlling column address lines such as [954], a plurality of values in a column of the arrays are retrieved and driven on to coupled column bit lines which pass through block selectors in arrays such as [950]. The blocks that are selected enable the values on the column bit line to appear on a coupled column data bus [952] at the output. Each nibble array provides one of four nibbles for each short word that is read out.

An arrangement with an embodiment as shown in FIG. 10 may be used as a matrix space to store, access, retrieve, hold, write, read or clear short words by rows or by columns or both.

A plurality of the embodiment shown in FIG. 10 may be used to create an array or matrix space for longer length binary words such as 32-bit, 48-bit and 64-bit words.

Storing and Accessing Matrices and Arrays Comprised of Long Words Inside a Matrix Space FIG. 11 shows one embodiment of a matrix space comprised of arrays that can hold matrices/arrays of long words. One embodiment of a matrix space is comprised of a plurality of array arrangements such as ones shown in the embodiment of FIG. 8. Another embodiment of a matrix space is comprised of a plurality of array arrangements created from the ones in FIGS. 9 and 10.

In the embodiment of a matrix space shown in FIG. 11 a bank arrangement [1100] is comprised of storage array [1111], pre-charge circuits [1109], [1110] coupled to row and column bit lines [1101], [1102] coupled to row and column block selectors with sense amplifiers [1108], [1107] at ports driving row and column data buses, respectively; also included in any such arrangement are a plurality of row and column address lines [1105], [1106] selected by row and column decoders [1103], [1104] to select the rows and columns of arrays to access, respectively. Four bank arrangements such as [1100] comprise the embodiment of the matrix space shown in FIG. 11. In the bank arrangement [1100] row bit lines (vertical bit lines in figure) [1101] are pre-charged by [1109] in the pre-charge phase of a clock (not shown) and are coupled to the cells of the arrays [1111] via FETs controlled by row address lines [1105].

To read a row of words, the row bit lines [1101] are pre-charged using pre-charge circuit [1109] in the pre-charge phase of a clock; a row address is presented to row address decoders such as [1103] in all four banks like [1100], which select row address line such as [1105] in the beginning of the read phase of the clock; row address line [1105] turns on the FETs which pass values read out of the array cells on to the row bit lines such as [1101] during the read phase; the values on the row bit lines such as [1101] are selected by the block selector and sensed by sense amplifiers [1108] that output the data word on to the row ports coupled to [1108]. This process happens simultaneously on each of the four array banks such as [1100]. In this embodiment of the invention each bank such as [1100] provides 16-bits of a 64-bit value for each element of a matrix or array.

Analogously, to read a column of words the column bit lines (horizontal bit lines) [1102] are pre-charged during pre-charge phase of clock; a column address is driven into column address decoders such as [1104] to select column address line such as [1106]. The selected column address line [1106] causes the coupled FETs to turn on and drive the values stored in cells in the selected columns to be read out on to column bit lines (horizontal bit lines in figure) such as [1102] coupled to block selectors such as [1107]; the selected column bit lines at the output of the block selectors [1107] are sensed by the sense amplifiers and the addressed column data is driven on to column data buses at the ports. Collating the values obtained on the column ports from all four banks provides 64-bit words at the outputs.

What is claimed is:

1. A matrix space comprising:
a first array of storage cells, wherein the first array of storage cells comprises:
a plurality of row bit lines comprising a set of row values;
a plurality of row logic switches controlled by one or more row address lines;
a plurality of column bit lines comprising a set of column values; and
a plurality of column logic switches controlled by one or more column address lines, wherein the plurality of row bit lines are coupled to the storage cells via the plurality of row logic switches, and wherein the plurality of column bit lines are coupled to the storage cells via the plurality of column logic switches; and
logic to perform one or more operations with one or more selected column bit lines, selected row bit lines, and selected storage cells, wherein writing via the plurality of row bit lines and writing via the plurality of column bit lines occur into separate and non-intersecting selection of the selected storage cells.

2. The matrix space of claim 1, wherein one or more block-selection multiplexers configured to select one or more subsets of binary values from the set of row values and the set of column values.

3. The matrix space of claim 1, wherein one or more address decoders configured to receive encoded row addresses and encoded column addresses and to select one or more predefined decoded row address lines and predefined decoded column address lines, wherein the predefined decoded row address lines are configured to control the plurality of row logic switches and the predefined decoded column address lines are configured to control the plurality of column logic switches.

4. The matrix space of claim 1, wherein the storage cells are selected from the group consisting of latches, flip-flops, static, dynamic, volatile, and non-volatile memory cells.

5. The matrix space of claim 1, wherein the row logic switches and the column logic switches are selected from the group consisting of pass-transistors, complementary pass-transistor switches, logic gate switches, N-type metal-oxide-semiconductor logic switches, P-type metal-oxide-semiconductor logic switches, and tristate buffers.

6. The matrix space of claim 1, wherein the plurality of column bit lines and row bit lines are selected from the group consisting of single-ended bit lines, complementary bit lines, dual rail bit lines, and hierarchical bit lines.

7. The matrix space of claim 1, wherein the one or more operations are selected from the group consisting of writing, reading, accessing, clearing, and presetting a value.

8. The matrix space of claim 1, wherein the plurality of row bit lines and the plurality of column bit lines are coupled to the one or more block selection multiplexers, block selection de-multiplexers, sense amplifiers, and pre-charge circuits.

9. The matrix space of claim 1, wherein the first array of storage cells comprises an array of macro cells, wherein each of the macro cells comprises a portion of the plurality of row bit lines, a portion of the plurality of column bit lines, and a portion of the storage cells, and wherein each of the macro cells is configured to store a binary word of a plurality of bits.

10. The matrix space of claim 9, wherein one or more block-selection multiplexers are configured to select a subset of binary words driven on the plurality of row bit lines and the plurality of column bit lines during a read operation, wherein the selection is driven on row and column data buses on the row and column data bus ports.

11. The matrix space of claim 10, further comprising block selection de-multiplexers configured to receive data on the row and column data buses and drive the data on a predefined subset of row bit lines and column bit lines, wherein block selection de-multiplexers select from the plurality of row bit lines and plurality of column bit lines, wherein the selection is used to write the driven data into coupled and addressed storage cells.

12. The matrix space of claim 9, wherein the macro cells comprise short binary words addressable and accessible by row or columns using coupled row and column data buses of selected column bit lines and selected row bit lines and controlling row address lines and controlling column address lines.

13. A matrix space comprising:
at least one nibble cell, wherein each of the at least one nibble cell comprises:
four storage cells configured to store a 4-bit binary value;
four row bit lines comprising a 4-bit row value;
a plurality of row logic switches controlled by one or more row address lines;
four column bit lines comprising a 4-bit column value; and
a plurality of column logic switches controlled by one or more column address lines, wherein the four row bit lines are coupled to the storage cells via the row logic switches and the four column bit lines are coupled to the storage cells via the four column logic switches, wherein writing via the four row bit lines and writing via the four column bit lines occur into separate and non-intersecting selection of the storage cells.

14. The matrix space of claim 13, wherein the matrix space comprises an array of nibble cells, wherein the array of nibble cells are organized in blocks along a plurality of row bit lines and a plurality of column bit lines.

15. The matrix space of claim 13, further comprising one or more row ports and column ports, wherein the one or more row ports and column ports allow for multiple simultaneous column and row operations.

16. The matrix space of claim 13, wherein the matrix space comprises a macro cell comprising four nibble cells, wherein the macro cell is configured to store a 16-bit binary word.

17. The matrix space of claim 16, wherein the matrix space is an array configured to store one or more 16-bit binary words, further comprising a plurality of macro cells.

18. A method of reading values from a matrix space, the method comprising the method steps of:
setting up one or both a plurality of row bit lines and a plurality of column bit lines during a setup phase of a controlling clock, wherein the matrix space comprises a plurality of arrays of storage cells, and wherein each of the plurality of arrays of storage cells comprise:
a plurality of row bit lines comprising a set of row values;
a plurality of row logic switches controlled by one or more row address lines;
a plurality of column bit lines comprising a set of column values; and
a plurality of column logic switches controlled by one or more column address lines, wherein the plurality of row bit lines are coupled to the storage cells via the plurality of row logic switches, and wherein the plurality of column bit lines are coupled to the storage cells via the plurality of column logic switches;

asserting an address at each input of address decoders, wherein the asserting identifies an addressed storage cell;

activating and selecting one or more decoded address lines using the address;

activating and selecting one or more transport paths from the plurality of row bit lines and the plurality of column bit lines by block-selection multiplexers;

reading contents of the addressed storage cell onto one or more of the plurality of row bit lines and the column bit lines in an evaluate phase of the controlling clock, wherein the reading contents of the addressed storage cell occurs separately from a writing of contents into the addressed storage cell, wherein writing via the plurality of row bit lines and writing via the plurality of column bit lines occur into separate and non-intersecting selection of the storage cells; and reading word values at outputs of the block-selection multiplexers.

19. The method of claim 18, wherein the setting up comprises the method steps of:
asserting control input values;
pre-charging the plurality of row bit lines and the plurality of column bit lines; and
activating logic required in preparation for a read operation.

20. A method to write values into a matrix space comprising the method steps of:
asserting the input values to be written to storage at the interface, wherein the matrix space comprises a plurality of arrays of storage cells, and wherein each of the plurality of arrays of storage cells comprise:
a plurality of row bit lines comprising a set of row values;
a plurality of row logic switches controlled by one or more row address lines;
a plurality of column bit lines comprising a set of column values; and
a plurality of column logic switches controlled by one or more column address lines, wherein the plurality of row bit lines are coupled to the storage cells via the plurality of row logic switches, and wherein the plurality of column bit lines are coupled to the storage cells via the plurality of column logic switches;

asserting an address at inputs of address decoders;
activating and selecting one or more decoded address lines using the address;
activating and selecting one or more transport paths from the plurality of row bit lines and the plurality of column bit lines using block-selection de-multiplexers;
setting up one or both the plurality of row bit lines and the plurality of column bit lines during a setup phase of a controlling clock; and
writing contents from one or both the plurality of row bit lines and the plurality of column bit lines into the addressed storage cells in a write phase of the controlling clock, wherein the writing via the plurality of row bit lines and the writing via the plurality of column bit lines occurs into separate and non-intersecting selection of the storage cells.

21. The method of claim 20, wherein the setup phase comprises the method steps of:
asserting input values; and
activating logic required in preparation for a write operation in a subsequent phase of the controlling clock.

* * * * *